United States Patent
Beck et al.

(10) Patent No.: US 9,309,158 B2
(45) Date of Patent: Apr. 12, 2016

(54) PROCESS FOR PRODUCING A PURE-PHASE MULTISUBSTANCE SYSTEM, A CERAMIC MATERIAL BASED ON THE PURE-PHASE MULTISUBSTANCE SYSTEM, A SHAPED BODY, AND A COMPOSITE FORMED THEREFROM

(75) Inventors: Karsten Beck, Neunkirchen A.S. (DE); Sven Albrecht, Goslar (DE); Christoph Schnitter, Holle (DE); Timo Langetepe, The Hague (NL); Ralph Otterstedt, Goslar (DE)

(73) Assignee: H.C. STARCK GMBH, Goslar (DE)

( * ) Notice: Subject to any disclaimer, the term of this patent is extended or adjusted under 35 U.S.C. 154(b) by 113 days.

(21) Appl. No.: 13/983,303

(22) PCT Filed: Feb. 3, 2012

(86) PCT No.: PCT/EP2012/051899
§ 371 (c)(1),
(2), (4) Date: Aug. 5, 2013

(87) PCT Pub. No.: WO2012/104430
PCT Pub. Date: Aug. 9, 2012

(65) Prior Publication Data
US 2013/0306902 A1 Nov. 21, 2013

(30) Foreign Application Priority Data

Feb. 4, 2011 (DE) .......................... 10 2011 010 346

(51) Int. Cl.
| | | |
|---|---|---|
| *C04B 35/495* | (2006.01) | |
| *C04B 35/626* | (2006.01) | |
| *H01G 9/042* | (2006.01) | |
| *H01L 41/187* | (2006.01) | |
| *H01L 41/43* | (2013.01) | |
| *C01G 33/00* | (2006.01) | |
| *C01G 35/00* | (2006.01) | |
| *C01B 33/00* | (2006.01) | |
| *C01F 7/00* | (2006.01) | |

(52) U.S. Cl.
CPC ............ *C04B 35/495* (2013.01); *C01G 33/006* (2013.01); *C01G 35/006* (2013.01); *H01L 41/1873* (2013.01); *H01L 41/43* (2013.01); *C01B 33/00* (2013.01); *C01F 7/00* (2013.01); *C01P 2002/52* (2013.01); *C01P 2004/10* (2013.01); *C04B 2235/3201* (2013.01); *C04B 2235/3203* (2013.01); *C04B 2235/3255* (2013.01); *C04B 2235/3281* (2013.01); *C04B 2235/3284* (2013.01); *C04B 2235/3294* (2013.01); *C04B 2235/445* (2013.01); *C04B 2235/5276* (2013.01); *C04B 2235/5436* (2013.01); *C04B 2235/6025* (2013.01); *C04B 2235/6027* (2013.01); *C04B 2235/768* (2013.01); *C04B 2235/77* (2013.01)

(58) Field of Classification Search
CPC ..... C01B 33/00; C01F 7/00; C04B 2235/445; C01G 33/00; C01G 25/00; C01G 35/00; C01G 27/00; C01G 30/00; C01G 31/00; C01G 39/00; C01G 41/00; C01G 47/00
See application file for complete search history.

(56) References Cited

U.S. PATENT DOCUMENTS

| | | | |
|---|---|---|---|
| 3,366,510 A | 1/1968 | Daendliker et al. | |
| 7,674,450 B2 * | 3/2010 | Beck et al. | ................... 423/606 |
| 2004/0058797 A1 | 3/2004 | Nonoyama et al. | |
| 2006/0006360 A1 | 1/2006 | Takao et al. | |
| 2008/0025912 A1 | 1/2008 | Beck et al. | |
| 2009/0102325 A1* | 4/2009 | Ozawa et al. | ................. 310/358 |
| 2010/0022381 A1 | 1/2010 | Tanaka et al. | |

FOREIGN PATENT DOCUMENTS

| | | |
|---|---|---|
| CN | 1238536 C | 1/2006 |
| JP | 63-025223 A | 2/1988 |
| JP | 63-025265 A | 2/1988 |
| JP | 8-41559 A | 2/1996 |
| JP | 2009242230 A | 10/2009 |

OTHER PUBLICATIONS

Guo et a, "Na0.5H0.5NbO3-LiTaO3 lead-free piezoelectric ceramics", Materials Letters 59, Oct. 2005, pp. 241-244.*
J. Li: "Structures and Properties of $Ta_2O_5$-based Solid Oxide Electrolyte", Chinese Master's, Database, Engineering Science and Technology I, No. 9, English Abstract and p. 19 (2009).
Y. Saito et al.: "Lead-free-piezoceramics", letters of nature, vol. 432, pp. 84-87 (2004).
Y. Guo et al.: "$(Na_{0.5}K_{0.5})NbO_3$-$LTaO_3$ lead-free piezoelectric ceramics", Materials Letters, vol. 59, pp. 241-244 (2005).
H. Lehl et al.: "Gmelins Handbuch der anorganischen Chemie, Niob Teil B 4", Verlag Chemie, p. 157 (1973).
C.-H. Lu et al.: "Hydrothermal synthesis of nonlinear optical potassium niobate ceramic powder", Materials Letters, vol. 34, pp. 172-176 (1998).

(Continued)

*Primary Examiner* — Carol M Koslow
(74) *Attorney, Agent, or Firm* — Norman B. Thot (57) ABSTRACT

A process for producing a homogenous multi compound system which is hydroxide- and/or oxide-based includes a first alternative process comprising providing a first and a second refractory metal in respective hydrofluoric solutions, and mixing the first and second hydrofluoric solutions to provide a mixed hydrofluoric solution comprising a dissolved first and second refractory metal. A second alternative process comprises dissolving the first and the second refractory metal in an alternative mixed hydrofluoric solution. The mixed hydrofluoric solution or the alternative mixed hydrofluoric solution is precipitated with a precipitant to provide a solids mixture in a suspension. The first and second refractory metal is from the group consisting of Mo, W, Nb, Re, Zr, Hf, V, Sb, Si, Al, and Ta. The first and second refractory metal are different. At least one of the first and second refractory metal is provided as a fluoro and/or as an oxyfluoro complex.

32 Claims, 10 Drawing Sheets

(56) References Cited

OTHER PUBLICATIONS

C. Pithan et al.: "Microemulsion mediated synthesis of nanocrystalline $(K_x,Na_{1-x})NbO_3$ powders", Journal of Crystal Growth, vol. 280, pp. 191-200 (2005).

D. Bayot et al.: "Homo- and Heterobimetallic Niobium and Tantalum Peroxo-tartrate Complexes and Their Use as Molecular Precursors for Nb-Ta Mixed Oxides", Inorganic Chemistry, No. 44, pp. 1554-1562 (2005).

B. Malic et al.: "Alkaline-earth doping in $(K,Na)NbO_3$ based piezoceramics", Journal of the European Ceramic Society, vol. 25, pp. 2707-2711 (2005).

A. Agulyansky: "The Chemistry of Tantalum and Niobium Flouride Compounds", Elsevier, pp. 293-299 (2004).

D. Huelsenberg et al.: "Sol-Gel-Prozess", ROEMPP Online, Version 3.16, pp. 1-4 (2010).

H. Muthurajan et al.: "Novel hydroxide precursors to prepare $NaNbO_3$ and $KnbO_3$", Ceramics International, vol. 34, pp. 671-673 (2008).

V. Samuel et al.: "A coprecipitation technique to prepare $NaNbO_3$ and $NaTaO_3$", Bull. Mater. Sci., vol. 29, No. 2, pp. 123-125 (2006).

\* cited by examiner

Fig. 1

(PRIOR ART)

Fig. 2

(PRIOR ART)

PROCESS FOR PRODUCING A PURE-PHASE MULTISUBSTANCE SYSTEM, A CERAMIC MATERIAL BASED ON THE PURE-PHASE MULTISUBSTANCE SYSTEM, A SHAPED BODY, AND A COMPOSITE FORMED THEREFROM

CROSS REFERENCE TO PRIOR APPLICATIONS

This application is a U.S. National Phase application under 35 U.S.C. §371 of International Application No. PCT/EP2012/051899, filed on Feb. 3, 2012 and which claims benefit to German Patent Application No. 10 2011 010 346.5, filed on Feb. 4, 2011. The International Application was published in German on Aug. 9, 2012 as WO 2012/104430 A1 under PCT Article 21(2).

FIELD

The present invention relates to a process for producing a homogeneous, hydroxide-based and/or oxide-based multisubstance system, for example, a homogeneous multisubstance system having a rodlet-shaped/rod shaped morphology (also called form), the multisubstance system comprising a first element from the group consisting of Ti, Zr, Hf, V, Nb, Cr, Mo, W, Re, Sb, Si, Al, and Ta and a second element from the group consisting of Ti, Zr, Hf, V, Nb, Cr, Mo, W, Re, Sb, Si, Al, and Ta, the first and/or second element taking the form more particularly of a fluorocomplex, more particularly $H_2NbF_7$, $H_2TaF_7$, $HSbF_6$, $H_2ZrF_6$, $H_2SiF_6$, $H_3AlF_6$, or the like. The present invention further relates to a ceramic material, to a molding composed of the ceramic material, and to an associated composite.

BACKGROUND

Ceramic mixed materials are mostly produced from corresponding oxides and carbonates, which for this purpose are ground intensively in ball mills, mixed, and then calcined at high temperatures. These processes do, however, require that a heterogeneous mixture be prepared, which undergoes reaction only incompletely to form a homogeneous phase, as a result of the calcining step.

The present-day, high-performance ceramics require extremely uniform distribution of elements without local accumulation of the principal components and dopants.

Increasing numbers of applications are using piezoelectric or corresponding ferroelectric properties of ceramic materials. For instance, distance measuring devices, ultrasound transducers, inkjet nozzles, and common-rail diesel injectors are being produced from high-performance ceramics. The ceramics presently used here are produced on the basis of lead zirconium titanate (PZT) and dopants.

In view of the increasing importance of the environmental compatibility of such actuators and resonators, efforts exist to eliminate components detrimental to health and to the environment from these electrical systems.

An alternative system of materials with piezoelectric properties is based on sodium potassium niobate. The piezoelectric properties of ceramic components made from this system of materials are dependent in particular (in addition to powder properties typically important for ceramics production, such as particle size or, correspondingly, particle size distribution, chemical purity, sintering activity, contraction, and so on) on the density, phase purity and/or chemical homogeneity, and complete or near-complete orientation of all of the ferroelectric and/or piezoelectric domains of the ceramic particles into an external preferential direction. This complete orientability of the domains is achieved in particular through the defined orientation of the maximum number of grains to an external electrical field. This electrical field produces a polarization.

Such orientation of the grains to the electrical field is achieved through the orientation of suitable platelet-shaped and/or needle-shaped single crystals during film/tape casting and during subsequent heteroepitactic or homoepitactic growth of the desired (pseudo)cubic phase from the sodium potassium niobate system of materials.

Suitable platelet- or corresponding needle-shaped crystallites form the precondition for the orientability of the grains in the ceramic or of the corresponding ferroelectric domains in these grains. These crystallites are obtainable by elaborate culturing of single crystals or by directed production during the synthesis of the ceramic powder.

In the state of the art, these ceramics are used for producing piezoelectric components. These components are an important element, for example, in mechatronics. Components of this kind are used particularly in diesel injection assemblies for powerful diesel engines with low emissions. The requirements imposed on such multilayer structures made of piezoelectric ceramics are enormously high.

The switching strokes are becoming ever larger and must be made with more rapid switching, and the function must also be able to be ensured under the extreme ambient conditions within the engine.

The poor recyclability of these components and the toxic lead material used has led to the search for piezoelectric materials which have technical properties similar to or better than those of PZT. One technical property is the piezoelectric coefficient $d_{33}$, which is indicated with the units pm/V. This piezoelectric coefficient is a measure of the longitudinal extent per volt of voltage over a metallized and poled ceramic sample in the small-signal range in the direction of the applied field.

In 2004, the automaker Toyota together with the supplier Denso published a composition for a piezoelectric ceramic in the journal Nature under the title "Lead free piezoceramics", Vol. 432 (2004), pp. 84-87, this ceramic having properties comparable with those of the present-day high-performance PZTs ($Pb(Zr_xTi_{1-x})O_3$).

This material consists of complex perovskites $AA'BB'O_3$ with essentially potassium and sodium at the A-site and niobium and tantalum at the B-site. An added dopant at the A-site is Li, and at the B-site Sb. The phase, moreover, is configured in platelet shape by a complicated template method. This means that there is a specific morphological orientation, by means of which the piezoelectric coefficient $d_{33}$ has been raised from around 250 pm/V to the PZT-comparable figure of 400 pm/V. The compound was prepared from different oxides ($Nb_2O_5$, $Ta_2O_5$) and carbonates ($K_2CO_3$, $Na_2CO_3$). This method is described in references including patents EP 138 2 588 and DE 102 005 027 928 and in the "Lead free piezoceramics" writeup in Nature 432 (2004) 84-87.

The inadequate miscibility of the patented niobium and tantalum compounds in the mixed-oxide method of Toyota and Denso is described in the article by Yiping Guo in Mater. Lett. 59 (2005), 241-244.

Older preparation prossesses exist for pure potassium niobate or sodium niobate with the particles having no special particle form. In the Russian journal I2v. Vysshikh Uchebn. Zavedenii Tsvetn. Met. (Nonferrous Metallurgy), 5 (1963), pp. 99-107, Zelikman describes the reaction of potassium hydroxide with niobium hydroxide in an autoclave at 150° C.-200° C. under pressure to give a soluble potassium compound ($K_8Nb_6O_{19}$), which by calcining at above 400° C. or with high KOH concentrations decomposes to form pure potassium niobate. This citation is also referenced by Gmelins Handbuch der anorganischen Chemie, Niobium, Part B4, Edition 8, 1974, p. 157.

The use of an autoclave and of the high temperatures for this process gives rise to high costs.

In the recovery of niobium and tantalum from ores and ore concentrates, there are processes known in which niobium oxides and tantalum oxides are leached out using concentrated alkalis (e.g., Hydrometallurgy 80, (2005), pp. 126-131; CN 1238536; JP 8041559).

Similar processes are used in the hydrothermal synthesis of potassium and sodium niobates, in which niobium oxide is digested in an autoclave with alkali metal hydroxides; C. H. Lu, Mater. Lett. 34 (1998) 172-176.

A further process is based on the hydrolysis of niobium and tantalum oxides. DE 125 7 125 to CIBA is one of the references describing this process. More in-depth articles include "microemulsion mediated synthesis of nanocrystalline $(K_xNa_{1-x})NBO_3$ powders", J. Crystal Growth, 280 (2005) 191-200, which uses oil-in-water emulsions to control the particle size.

In order to obtain soluble compounds, it is also possible to employ complexes of the niobium and tantalum oxides. In this case, tartrates and peroxotartrates play a predominant role among the carboxylic acids. These complexes are subsequently decomposed at high temperatures to form the target compounds (niobates). Examples of this can be found in M. Devillers, Inorg. Chem. 44, (2005), pp. 1554-1562 or B. Malic, J. Eur. Ceram. Soc. 25, (2005), pp. 2707-2711.

In the case as well of the use of sodium potassium niobate (also called NKN below) as a system of materials for piezoelectric components, the piezoelectric parameters are dependent on particle size, purity, sintering activity, contraction, and the like, and also on homogeneity. A greater homogeneity is achieved by higher calcining temperatures. In the case of NKN, however, this leads to evaporation of the volatile potassium oxide.

SUMMARY

An aspect of the present invention is to provide an improvement with respect to the state of the art.

In an embodiment, the present invention provides a process for producing a multi compound system which is homogeneous and which is at least one of hydroxide-based and oxide-based which includes a first alternative process which comprises providing a first metal precursor in a first hydrofluoric solution, providing a second metal precursor in a second hydrofluoric solution, and mixing the first hydrofluoric solution and the second hydrofluoric solution so as to provide a mixed hydrofluoric solution comprising a dissolved first metal precursor and a dissolved second metal precursor. A second alternative process comprises dissolving the first metal precursor and the second metal precursor in an alternative mixed hydrofluoric solution. The mixed hydrofluoric solution or the alternative mixed hydrofluoric solution is precipitated with a precipitant so as to provide a solids mixture in a suspension. The first metal precursor is from the group consisting of Mo, W, Nb, Re, Zr, Hf, V, Sb, Si, Al, and Ta. The second metal precursor is from the group consisting of Mo, W, Nb, Re, Zr, Hf, V, Sb, Si, Al, and Ta. The first metal precursor is different from the second metal precursor. At least one of the first metal precursor and the second metal precursor is provided as at least one of a fluoro complex and as an oxyfluoro complex.

BRIEF DESCRIPTION OF THE DRAWINGS

The present invention is described in greater detail below on the basis of embodiments and of the drawings in which.

DETAILED DESCRIPTION

In an embodiment of the present invention, a process for producing a homogeneous, hydroxide-based and/or oxide-based multisubstance system is provided, for example, a homogeneous multisubstance system having a rodlet-shaped/rod-shaped morphology (form), the multisubstance system comprising a first metal precursor from the group consisting of Mo, W, Nb, Re, Zr, Hf, V, Sb, Si, Al, and Ta and a second metal precursor from the group consisting of Mo, W, Nb, Re, Zr, Hf, V, Sb, Si, Al, and Ta, and the first metal precursor and the second metal precursor being different, the first metal precursor and/or the second metal precursor being present more particularly in the form of a fluoro and/or oxyfluoro complex, more particularly $H_2Nb_7$, $H_2TaF_7$, $HSb_6$, $H_2ZrF_6$, $H_2SiF_6$, $H_3AlF_6$, or the like, where in the first alternative the first metal precursor is present in a first hydrofluoric solution and the second metal precursor is present in a second hydrofluoric solution, and the first hydrofluoric solution with the first metal precursor and the second hydrofluoric solution with the second metal precursor are mixed, to give a mixed hydrofluoric solution with dissolved first metal precursor and second metals precursor, or in a second alternative, the first metal precursor and the second metal precursor are dissolved in an alternative mixed hydrofluoric solution, and finally the mixed hydrofluoric solution or the alternative mixed hydrofluoric solution is precipitated with a precipitant to give a solids mixture in a suspension.

Is possible as a result to provide a suspension with a homogeneous mixture of solids.

A multisubstance system is termed "homogeneous" more particularly when in the associated X-ray spectrum there is little or no apparent phase separation. Little phase separation is assumed when the signals of the foreign or ultrapure phases are present to only a minor extent. This is the case when the signals disappear (are not visible) in the noise of the analytical signal or account for only a few percent (<5%) on quantitative evaluation of the signal peaks.

A "multisubstance system" may comprise at least two refractory metals. It is possible, however, for further refractory metals and/or doping elements to be encompassed in the multisubstance system.

A multisubstance system can be said to be "hydroxide-based and/or oxide-based" if the anionic component of the compound is present primarily, in other words in a fraction of >85%, in the form of an oxide ($O^2$ ion) or a hydroxide ($OH^-$ ion).

A "rodlet-shaped morphology" or "rod-shaped morphology" (form) exists especially when the length to width ratio has a value of between 3 and 10, for example, of 5 or more.

"Hydrofluoric solutions" are, for example, understood to be aqueous solutions which comprise hydrogen fluoride and/or its ions.

In an embodiment of the present invention, the mixed hydrofluoric solution or the alternative mixed hydrofluoric solution may be admixed with a third or a further hydrofluoric solution with a dissolved third or further metal from the group of the refractory metals Mo, W, Nb, Re, Zr, Hf, V, and Ta prior to the precipitation. As a result, the ceramic to be produced may comprise further refractory metals.

This advantage may likewise be acquired by dissolving, in the mixed hydrofluoric solution or in the alternative mixed hydrofluoric solution, a third or further refractory metal from the group consisting of Mo, W, Nb, Re, Zr, Hf, V, and Ta prior to the precipitation.

In order to endow the ceramic to be produced with particular electrical properties, it is possible for a doping element from the group consisting of Ti, Zr, Sn, Fe, Co, Ni, Ca, Zn, Pd, Cd, Al, Si, P, Ge, As, Se, Sb, Te, Sc, Y, and Yb to be present in solution in the first hydrofluoric solution and/or in the second hydrofluoric solution and/or in the mixed hydrofluoric solution and/or in the alternative mixed hydrofluoric solution and/or in the precipitant and/or in a first hydrofluoric doping element solution, and, where the doping element is present in solution in the doping element solution and/or in the precipitant, the doping element solution and/or the precipitant are/is added to the first hydrofluoric solution, the second hydrofluoric solution, the mixed hydrofluoric solution, or the alternative mixed hydrofluoric solution, and so the doping element on precipitation precipitates at least partly in the form of oxide or hydroxide.

A "doping element" is, for example, an element from the periodic table of the elements that is added to the multisubstance system in order to modify the specific properties and that accounts for a concentration of less than 10% and may be termed a secondary constituent.

"Precipitants" may include, for example, all substances, liquids, or materials which change the pH in such a way that solids are formed in an environment.

In an embodiment of the present invention, the precipitant may comprise a basic solution, a basic solid, or a basic gas, and the precipitation may take place at a pH of between 6.5 and 14 on the part of the mixed hydrofluoric solution or the alternative mixed hydrofluoric solution. The pH may here initially be determined roughly during the precipitation, by means of indicator paper, and, when there is no likelihood of destruction of the pH electrode, it can be determined by means of a commercial glass electrode or pH determination—Mettler-Toledo, for example.

To obtain a product having a rodlet-shaped particle morphology, precipitation may take place in two stages, with the precipitant first being added only up to a pH of 12 to 13.5, for example, 12 to 13, or, for example, 12 to 12.5, followed by stirring for 30 to 50 minutes, for example, for 30 to 45 minutes, or, for example, for 30 to 40 minutes, after which only then is the remaining precipitant added up to a pH value (pH 14).

A rod-shaped particle morphology on the part of the ceramic powder may bring about a preferred orientation of the particles and hence a better orientation of the ferroelectric domains in the moldings produced from the powder. This may significantly increase the piezoelectric effect in relation to moldings produced from ceramic powders with irregularly shaped particles.

A "basic reagent" encompasses, for example, a chemical substance which raises the pH in the aqueous medium. Such reagents may include solutions (such as, for example but not exclusively, aqueous sodium hydroxide or potassium hydroxide solutions), solids (such as, for example, but not exclusively, sodium hydroxide, potassium oxide, lithium hydroxide) or gases (such as, for example, but not exclusively, ammonia).

To produce a pure-phase target ceramic, the basic solution may comprise a hydroxide solution, the hydroxide solution comprising at least one dissolved amphoteric element, wherein the hydroxide solution preferably comprises a first alkali metal element to give a first suspension with a first intermediate which in the solids fraction comprises in uniform distribution (homogeneously) the first alkali metal element. To produce the pure-phase target ceramic, the basic solution may alternatively comprise:

a first alkali metal hydroxide solution and/or a first alkaline earth metal hydroxide solution, or a first mixture of two or more alkali metal hydroxide solutions and/or a first mixture of two or more alkaline earth metal hydroxide solutions, or a first mixture of one or more alkali metal hydroxide solutions and/or a first mixture of one/or more alkaline earth metal hydroxide solutions, the alkali and/or alkaline earth metal hydroxide solutions comprising at least one dissolved amphoteric element, wherein the first alkali metal hydroxide solution preferably comprises a first alkali metal element, and the first alkaline earth metal hydroxide solution comprises a first alkaline earth metal element, and the first mixture of two or more alkali metal hydroxide solutions comprises two or more alkali metal elements, and the first mixture of two or more alkaline earth metal hydroxide solutions comprises two or more alkaline earth metal elements, to give the first suspension with the first intermediate which in the solids fraction comprises in uniform distribution (homogeneously) the first alkali metal element or the mixture of two or more alkali metal elements and/or the first alkaline earth metal element or the mixture of alkaline earth metal elements.

In an embodiment of the present invention, the hydroxide solution may further comprise an aqueous hydroxide and/or a hydroxide complex, for example, KOH, LiOH, NaOH, RbOH, $Ca(OH)_2$ and/or a hydroxide complex of the elements selected from the group consisting of zinc, aluminum, and antimony. By this means, it is possible to provide inexpensive and easy-to-handle hydroxide solutions.

In an embodiment of the present invention, the suspension may be filtered, leaving the solids mixture as the suspension residue.

In order to purify the suspension residue to remove unwanted substances, the suspension residue may be washed.

In an embodiment of the present invention, the suspension or the suspension residue may be dried to give a dried residue, the drying taking place, for example, at temperatures of ≤150° C. It is therefore possible to reduce the energy for drying and to bring down the costs of drying.

To achieve a homogeneous particle distribution, the suspension or the suspension residue may be mixed.

In an embodiment of the present invention, the suspension, the suspension residue, the dried residue, the mixed suspension residue and/or the mixed suspension may be admixed with a basic solution on an aqueous and/or organic basis, to give a first intermediate.

In order to bring about uniform precipitation, the addition of the basic solution may take place with stirring.

In order to introduce the doping elements homogeneously into the target ceramic, the second basic solution may comprise an alkali metal hydroxide solution and/or an alkaline earth metal hydroxide solution or a mixture of two or more alkali metal hydroxide solutions and/or a mixture of two or more alkaline earth metal hydroxide solutions, the alkali metal hydroxide solution comprising an alkali metal element, and the alkaline earth metal hydroxide solution comprising an alkaline earth metal element, and the mixture of two or more alkali metal hydroxide solutions comprising two or more alkali metal elements, and the mixture of two or more alkaline earth metal hydroxide solutions comprising two or more alkaline earth metal elements, to give the second intermediate, which comprises in uniform distribution an alkali metal element or a mixture of two or more alkali metal elements and/or an alkaline earth metal element or a mixture of alkaline earth metal elements In an embodiment of the present invention, the addition of the basic solution may take place at temperatures between 0° C. and 40° C., for example, at room temperature, under a pressure of between 800 mbar and 1200 mbar, for example, under atmospheric pressure. In this way the process can be produced with standard production conditions, for example, with no autoclaves.

In order to obtain the target material or the end product, the first or second intermediate may be heat-treated at a temperature between 100° C. and 1000° C., for example, between 400° C. and 700° C., to give a ceramic material and a byproduct.

In an embodiment of the present invention, the byproduct may be washed out by means of water. In this way, it is possible to provide an inexpensive technique for removing the byproduct.

In order to generate a ceramic powder having good processing qualities, the ceramic material may be dried and/or ground to give a ceramic powder with a fine particle distribution for ceramic shaping.

In an embodiment of the present invention, an auxiliary/additive may be added to control particle agglomeration during grinding and/or during drying. Auxiliaries used may be a variety of binders.

"Particle agglomeration" is present more particularly when (individual) particles adhere to one another and in this way an agglomerated particle is formed from a plurality of individual particles.

For further processing of the resultant materials, process products obtained may be dried, slurried, isolated by filtration and/or comminuted.

In an embodiment of the present invention, a ceramic material is provided, for example, in the form of powder or pastes, the ceramic material being obtained by any of the processes described above.

In this way, it is possible to provide a material which can be further-processed, for example, to a green body.

In an embodiment of the present invention, a shaped body (molding) which is produced from the above-described ceramic material, the shaped body being obtained, for example, by means of uniaxial or cold isostatic pressing; film casting with optional subsequent stacking and/or screenprinting of green contact layers; PIM (power injection molding); wet powder spraying; slip casting; or sintering.

It is thus possible to provide a shaped body which finds application in the technical field.

In an embodiment of the shaped body, a metallic contact-connection may be attached to the shaped body, for example, during sintering. In this way it is possible to provide an electronic component having metallic connections.

To save on costs, the metallic contact-connection may comprise an Ag—Pd alloy having a Pd content of ≤25%, for example, ≤15%, or, for example, ≤7.5%. The Ag—Pd alloy having a Pd content of ≤25% may be used at temperatures of ≤1200° C., for example, ≤1175° C. The Ag—Pd alloy with 15% Pd may be employed at temperatures of ≤1100° C., and the Ag—Pd alloy with ≤7.5% Pd may be employed at temperatures of ≤1000° C., for example, of ≤950° C.

In an embodiment of the present invention, the metallic contact-connection may comprise an Ag alloy which is free of Pd. It is therefore possible to provide an alternative to Ag—Pd alloys.

In an embodiment of the present invention, a composite is provided, for example, a piezoelectric element as used in distance measuring devices, ultrasound transducers, inkjet nozzles, and common-rail diesel injectors, the composite comprising an above-described shaped body.

Elucidated hereinafter are working examples of the present invention, and also of the state of the art, with the aid of the figures.

Figure 1:
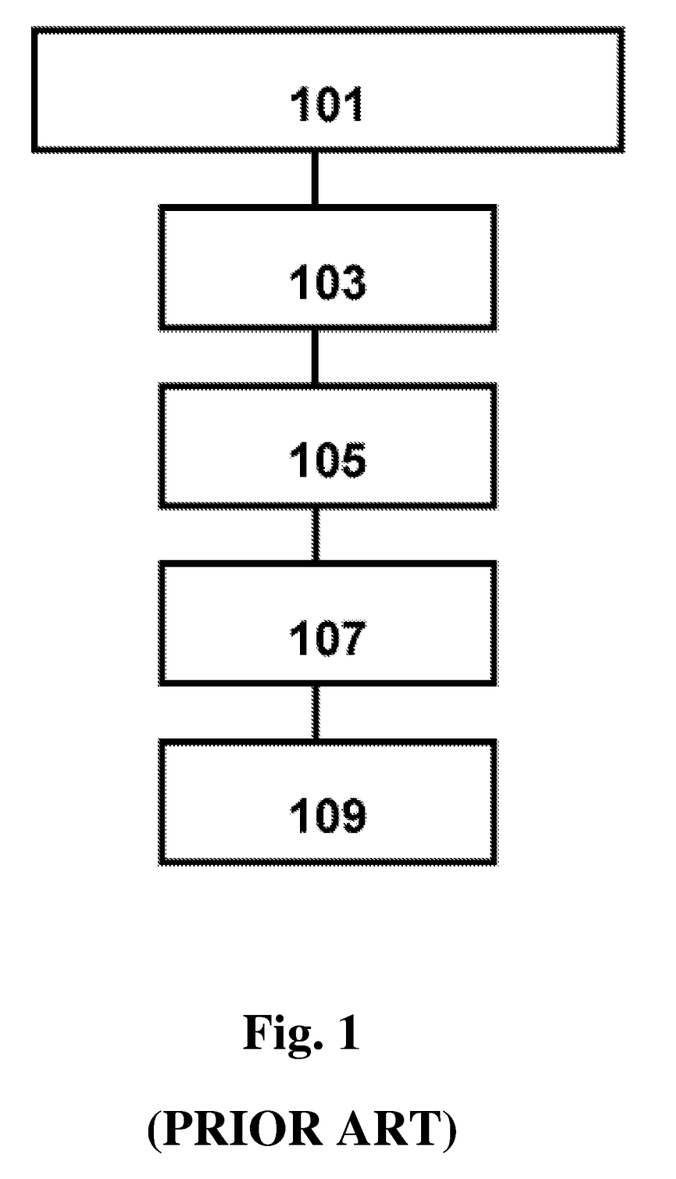
FIG. 1 shows a production process for state-of-the-art lead-containing ceramic compounds.

The basic sequences for producing lead-containing compounds are shown in FIG. 1. Starting materials present in a first step 101 are, for example, PbO, $ZrO_2$, $TiO_2$, $MgCO_3$ and/or $Nb_2O_5$. In a second step 103, these starting materials are ground and mixed in a ball mill. The fractions of the starting materials are determined according to the desired target material.

In a further step 105, the mixed starting materials are calcined at high temperatures such as 1000° C., for example. The calcined material is subsequently 107 again ground in a ball mill and mixed, giving ultimately, lastly, 109 the desired ceramic powder.

Figure 2:
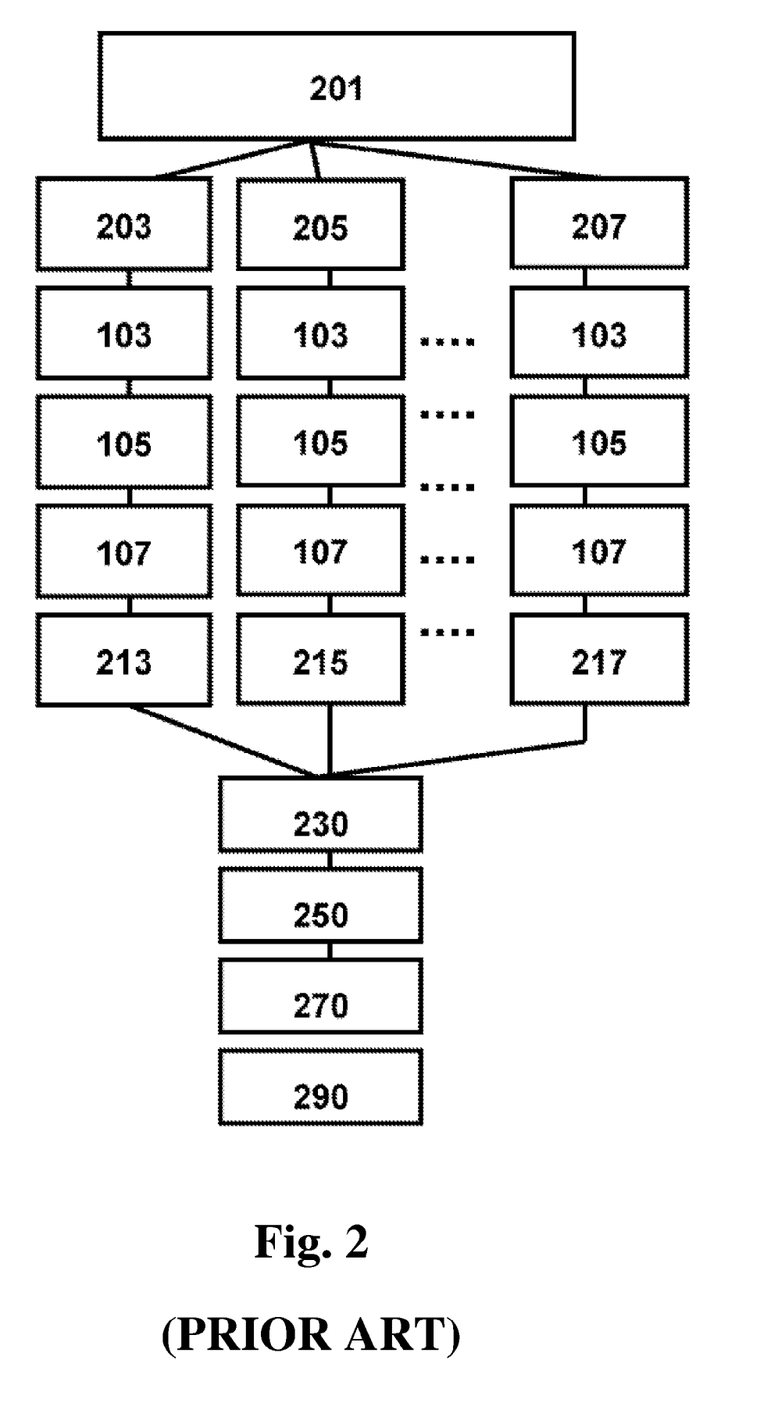
FIG. 2 shows a production process for state-of-the-art lead-free ceramic compounds.

FIG. 2 shows the state of the art for the basic production of lead-free ceramic compounds. For production of lead-free compounds, initially present 201 are starting materials such as $Nb_2O_5$, $Ta_2O_5$, $Na_2CO_3$, $K_2CO_3$, $Li_2CO_3$ and/or $Sb_2O_5$. These starting materials are, for example, mixed in pairs. Examples here may include the following mixtures: $Na_2CO_3$ and $Nb_2O_5$ 203; $Ta_2O_5$ and $Li_2CO_3$ 205; or $K_2CO_3$ and $Sb_2O_5$, 207.

These mixtures 203, 205, 207 are mixed and ground in a subsequent step 103. This is followed 105 by calcining and subsequently 107 by further mixing and grinding, to give the mixture $NaNbO_3$ 213 for the first mixture 203; the mixture $LiTaO_3$ 215 for the second mixture 205; and, as a last example, mixture 207, the mixture $KSbO_3$ 217.

In a further step 230, the newly produced mixtures 213, 215, 217 are ground and mixed in a ball mill. In the subsequent step 250, calcining takes place, followed by a further step 270 of grinding in the ball mill and commixing. After this process, finally, there is 290 a lead-free ceramic powder.

Figure 3:
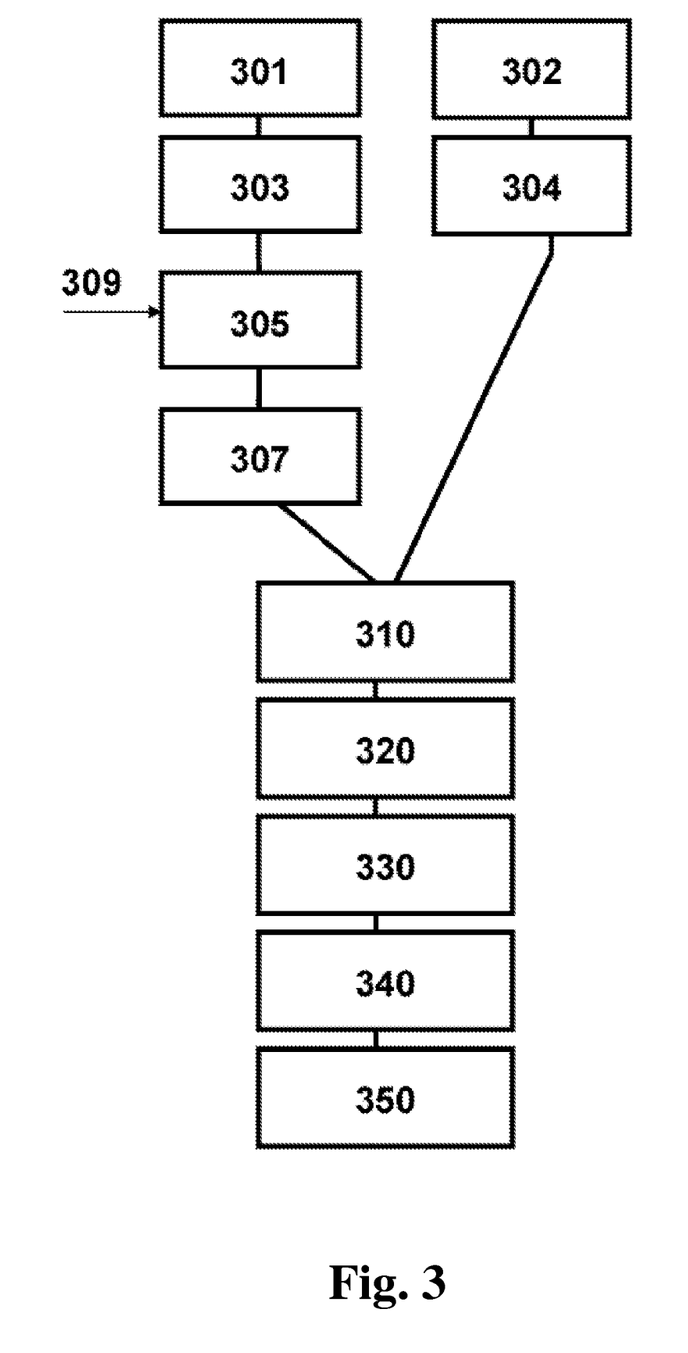
FIG. 3 shows a first inventive production process for lead-free ceramic compounds.

FIG. 3 shows a basic representation of the inventive production process. Initially 301, 302 there are aqueous hydroxides and/or hydroxide complexes 302 and fluoro complexes 301 in solution in HF.

The fluoro complexes 301 in solution in HF are, for example, $H_2NbF_7$, $H_2TaF_7$, $HSbF_6$, $H_2ZrF_6$, $H_2SiF_6$ and/or $H_3AlF_6$. These fluoro complexes 301 in HF solution are mixed in a first step 303. Through addition 309 of a basic solution such as $NH_3$, KOH, LiOH, NaOH, RbOH, $Ca(OH)_2$ and/or $H_2Zn(OH)_4$, in a further step 305, the mixed solutions are precipitated and washed, giving subsequently a hydroxide suspension 307.

The aqueous hydroxides and/or hydroxide complexes 302 initially present are mixed in a further process step 304. Aqueous hydroxides and hydroxide complexes are more particularly KOH, LiOH, NaOH, RbOH, $Ca(OH)_2$ and/or a hydroxide complex of the elements selected from the group consisting of zinc, aluminum, antimony or tin. A zinc complex may be present in the form, for example, of a compound with the chemical composition $H_2Zn(OH)_4$.

In a further step 310, the mixed aqueous hydroxides and/or hydroxide complexes 304 are mixed with the hydroxide suspension 307 in a stirring mechanism. This mixture 310 is subsequently filtered 320, dried and calcined 330, then again ground and washed 340, giving, finally, a ceramic powder 350.

Figure 4:
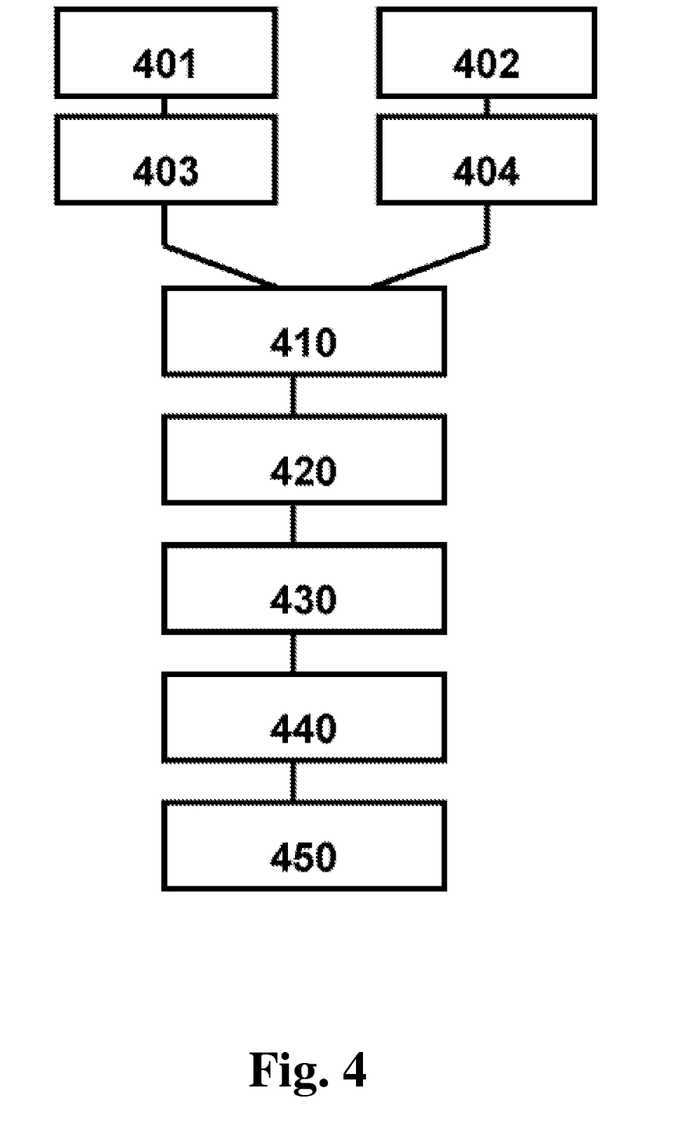
FIG. 4 shows an alternative inventive production process for lead-free ceramic compounds.

Shown in FIG. 4 is an alternative inventive production process. Initially present 401 are fluoro complexes such as $H_2NbF_7$, $H_2TaF_7$, $HSbF_6$, $H_2ZrF_6$, $H_2SiF_6$ and/or $H_3AlF_6$ in solution in hydrogen fluoride. At least two dissolved fluoro complexes are mixed in a further step 403.

Present initially in parallel with these are, 402, aqueous hydroxides and/or hydroxide complexes such as KOH, LiOH, NaOH, RbOH, $Ca(OH)_2$ and/or a hydroxide complex of the elements selected from the group consisting of zinc, aluminum, antimony, or tin. In a further step 404 these components are dissolved and at least two hydroxides and/or hydroxo complexes are mixed.

The mixed fluoro complexes after the mixing step 403 are precipitated, by means of the mixtures of the aqueous hydroxides or hydroxo complexes after step 404, in a subsequent step 410. This is followed 420 by the washing and filtering of the precipitated product. In a further step 430, the filtered product is dried and calcined, after which 440 the calcined product is ground and washed. Finally 450 the desired ceramic powder is present.

Set out below by way of example are production processes for individual lead-free ceramics for piezoelectric components.

EXAMPLES

Example 1

The intention in a first example was to prepare $(K_{0.52}Na_{0.44}Li_{0.04})(Nb_{0.86}Ta_{0.10}Sb_{0.04})O_3$. To that end, 3.160 l of an $H_2NbF_7$ solution in hydrofluoric acid (40%) with a loading of 126.6 g of $Nb_2O_5$ per liter, and 0.516 l of an $H_2TaF_7$ solution in hydrofluoric acid (40%) with a loading of 149.84 g of $Ta_2O_5$ per liter, was mixed in a 2 l Teflon beaker, 20.4 g of $Sb_2O_5$ was added, and the mixture was stirred for 2 days.

After the solid was isolated by filtration, the cohydroxide was precipitated by means of ammonia solution (25%) up to pH 9. The pH was determined using litmus paper up to pH=6 and a glass electrode thereafter. The suspension was filtered and the residue was washed with 5 l of aqueous ammonia (3%) and thereafter with 2 l of water.

To verify the composition of the oxide, the product obtained was analyzed. This was done by drying a portion at 105° C. in porcelain boats for 18 hours and calcining it at 1000° C. The analysis corresponds in the suspension to the compound $(Nb_{0.86}Ta_{0.10}Sb_{0.04})(OH)_5$.

To produce the ceramic material, 49.35 g of KOH, 41.4 g of NaOH, 3.26 g of $LiOH \cdot H_2O$ were dissolved with slow addition over a period of 30 minutes in 100 ml of deionized $H_2O$ (DI), and separately 539.19 g of $(Nb_{0.86}Ta_{0.10}Sb_{0.04})(OH)_5$ were weighed in. The viscous $(Nb_{0.86}Ta_{0.10}Sb_{0.04})(OH)_5$ suspension was dispersed for 5 minutes with a mixer (Mulinette). After cooling to room temperature, the above alkali solution was added in portions (in ten individual lots within an hour) and the mixture was stirred for one hour. The suspension was filtered and the residues were dried at 60° C. for 17 hours, then slurried, then isolated by filtration, and dried at 60° C. and subsequently comminuted and calcined at 600° C. for 2 hours, then slurried and isolated by filtration, and again dried and comminuted at 120° C. Analysis of the resultant ceramic material corresponds, at $(K_{0.55}Na_{0.43}Li_{0.02})(Nb_{0.86}Ta_{0.10}Sb_{0.03})O_3$, to the desired compound within the bounds of analytical imprecision.

This ceramic material may be processed further, for example, to form sintered tablets. For this purpose, the ceramic powder was ground until the average particle size as measured by Mastersizer (Malvern, laser diffraction) in accordance with ASTM B 822 was less than 5<µm, and was pressed with an isostatic press to give tablets of 1 cm in diameter and about 2 mm in height. The tablets were sintered at 980° C. for 2 hours. This produced compacts having sintered densities of around 97% of the theoretical density.

Figure 6:
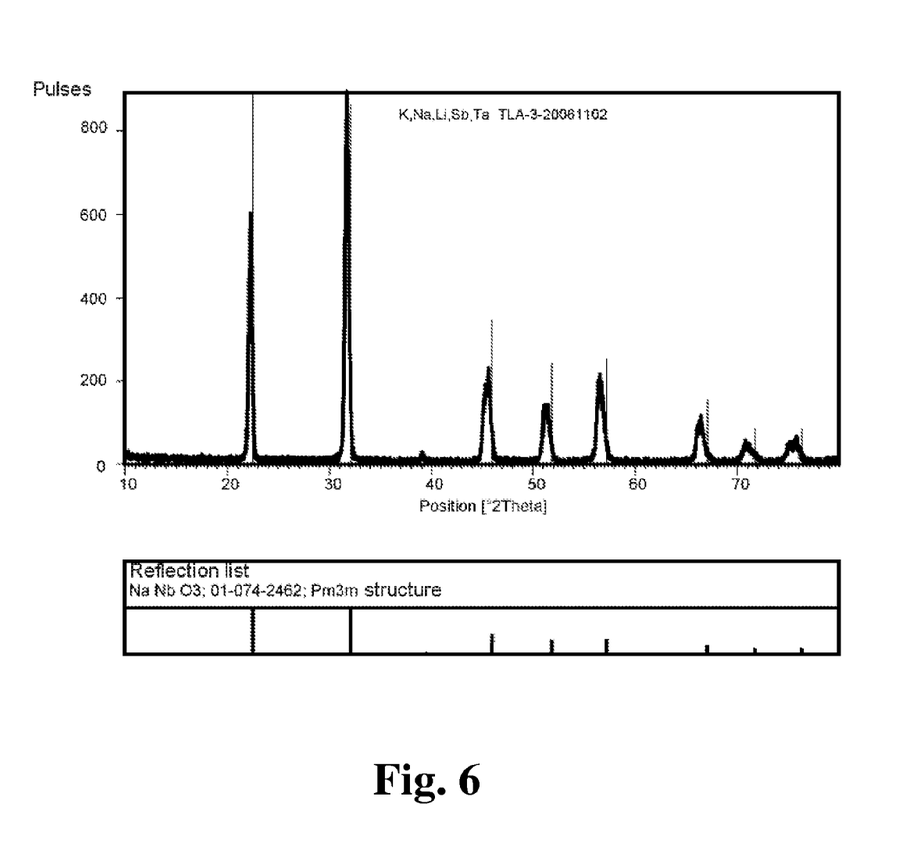
FIG. 6 shows an X-ray spectrum for the ceramic material obtained according to Example 1.

The X-ray spectrum of the ceramic material obtained according to Example 1 is shown in FIG. 6.

Example 2

The intention in a second example was to prepare $(K_{0.52}Na_{0.44}Zn_{0.04})(Nb_{0.86}Ta_{0.10}Sb_{0.04})O_3$. To that end, 3.160 l of an $H_2NbF_7$ solution in hydrofluoric acid (40%) with a loading of 126.6 g of $Nb_2O_5$ per liter, and 0.516 l of an $H_2TaF_7$ solution in hydrofluoric acid (40%) with a loading of 149.84 g of $Ta_2O_5$ per liter, was mixed in a 2 l Teflon beaker, 20.4 g of $Sb_2O_5$ was added, and the mixture was stirred for 2 days. After the solid was isolated by filtration, the cohydroxide was precipitated by means of ammonia solution (25%) up to pH 9. The pH was determined using litmus paper up to pH=6 and a glass electrode thereafter. The suspension was filtered and the residue was washed with 5 l of aqueous ammonia and thereafter with 2 l of water.

To verify the composition of the oxide, the product obtained was analyzed. This was done by drying a portion at 105° C. in porcelain boats for 18 hours and calcining it at 1000° C. The analysis corresponds in the suspension to the compound $(Nb_{0.86}Ta_{0.10}Sb_{0.04})(OH)_5$.

To produce the ceramic material, 49.35 g of KOH, 41.4 g of NaOH, 5.46 g of $ZnCl_2$ were dissolved with slow addition over a period of 30 minutes in 100 ml of deionized $H_2O$ (DI), and separately 208.92 g of $(Nb_{0.86}Ta_{0.10}Sb_{0.04})(OH)_5$ powder were weighed in and slurried in 100 ml of $H_2O$. The viscous $(Nb_{0.86}Ta_{0.10}Sb_{0.04})(OH)_5$ suspension was dispersed for 30 minutes with a shaker (Mulinette). After cooling to room temperature, the above alkali solution was added in portions (in ten individual lots within an hour) and the mixture was stirred for 5 hours. The suspension was filtered and the residues were dried at 60° C. for 17 hours, then slurried, then isolated by filtration, and dried at 60° C. for 17 hours and subsequently comminuted and calcined at 600° C. for 2 hours, then slurried and subsequently isolated by filtration, and dried and comminuted at 120° C. Analysis of the resultant ceramic material corresponds, at $(K_{0.47}Na_{0.43}Zn_{0.02})(Nb_{0.85}Ta_{0.09}Sb_{0.04})O_3$, to the desired compound within the bounds of measurement imprecision.

Figure 7:
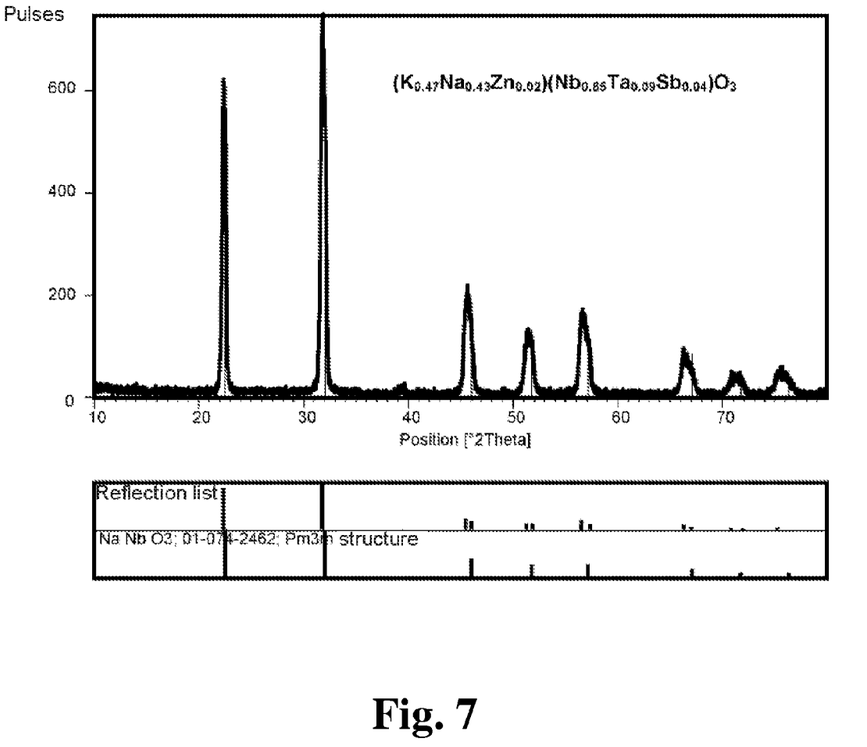
FIG. 7 shows an X-ray spectrum for the ceramic material obtained according to Example 2.

The X-ray spectrum of the ceramic material obtained according to Example 2 is shown in FIG. 7.

Example 3

The intention in a third example was to prepare $(K_{0.52}Na_{0.44}Cu_{0.04})(Nb_{0.86}Ta_{0.10}Sb_{0.04})O_3$. To that end, 3.160 l of an $H_2NbF_7$ solution in hydrofluoric acid (40%) with a loading of 126.6 g of $Nb_2O_5$ per liter, and 0.516 l of an $H_2TaF_7$ solution in hydrofluoric acid (40%) with a loading of 149.84 g of $Ta_2O_5$ per liter, were mixed in a 2 l Teflon beaker, 20.4 g of $Sb_2O_5$ was added, and the mixture was stirred for 2 days.

After the solid was isolated by filtration, the cohydroxide was precipitated by means of ammonia solution (25%) up to pH 9. The pH was determined using litmus paper up to pH=6 and a glass electrode thereafter. The suspension was filtered and the residue was washed with 5 l of aqueous ammonia and thereafter with 2 l of water.

To verify the composition of the oxide, the product obtained was analyzed. This was done by drying a portion at 105° C. in porcelain boats for 18 hours and calcining it at 1000° C. The elemental analysis of the oxide corresponds in the suspension to the compound $(Nb_{0.86}Ta_{0.10}Sb_{0.04})(OH)_5$.

To produce the ceramic material, 49.35 g of KOH, 41.4 g of NaOH, 4.42 g of $Cu_2CO_3(OH)_2$ were cautiously dissolved with slow addition over a period of 30 minutes in 100 ml of deionized $H_2O$ (DI), and separately 208.92 g of $(Nb_{0.86}Ta_{0.10}Sb_{0.04})(OH)_5$ was weighed in. The viscous $(Nb_{0.86}Ta_{0.10}Sb_{0.04})(OH)_5$ suspension was dispersed for 30 minutes. After cooling to room temperature, the above alkali solution was added in portions (in ten individual lots within an hour) and the mixture was stirred for 5 hours. The suspension was filtered and the residues were dried at 60° C. for 17 hours, then slurried in succession first with 500 ml of half-concentrated $HNO_3$ and subsequently with 1 l of water and 500 ml of aqueous ammonia, then isolated by filtration, and dried at 60° C. for 17 hours and subsequently comminuted and calcined at 600° C. for 2 hours, then slurried and isolated by filtration, and again dried and comminuted at 120° C. Analysis of the resultant ceramic material corresponds, at $(K_{0.51}Na_{0.40}Cu_{0.01})(Nb_{0.85}Ta_{0.09}Sb_{0.04})O_3$, to the desired compound within the bounds of analytical imprecision.

In Examples 1 to 3, it emerged that the calcining temperatures can be lowered significantly and evaporation of the volatile potassium oxide limited or reduced. Calcining temperatures which can be employed are, for example, temperatures between 400° C. and 900° C. and, for example, temperatures between 500° C. and 700° C.

Figure 8:
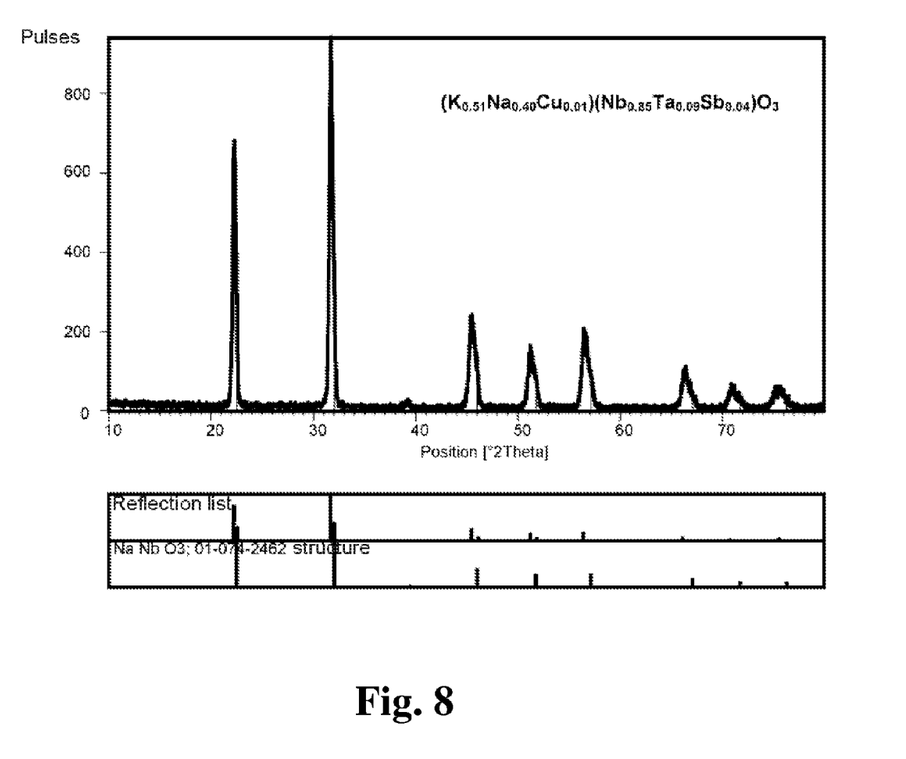
FIG. 8 shows an X-ray spectrum for the ceramic material obtained according to Example 3.

The X-ray spectrum of the ceramic material obtained according to Example 3 is shown in FIG. 8.

Example 4

In a fourth example the intention was to produce $(K_{0.52}Na_{0.44}Li_{0.04})(Nb_{0.86}Ta_{0.10}Sb_{0.04})O_3$ with regular particles. To that end, 448.8 g of KOH, 414.0 g of NaOH, 16.3 g of $LiOH*H_2O$ were dissolved in 1600 ml of deionized $H_2O$ (DI). Then 311.2 ml of $H_2TaF_7$ solution in hydrofluoric acid (c=142 g/l) and 2033.9 ml of $H_2NbF_7$ in hydrofluoric acid (c=113 g/l) were mixed in a Teflon beaker, and 21.02 g of $KSb(OH)_6$ was added. After the hydrofluoric solution cooled to room temperature, the alkali solution was added dropwise over the course of 120 minutes.

At the end, the turbid mixture had a pH of 12.3, and was stirred for a further 3 hours. The suspension was filtered and the residues was washed with 10 l of $NH_3$ 3% (aqueous ammonia) and with 10 l of deionized water. The suspension was subsequently dried at 60° C. for 17 hours and then comminuted. The solid was calcined at 600° C. for 2 hours, then washed with 10 liters of 3% $NH_3$ (aqueous ammonia) and with 10 liters of deionized water, and dried at 160° C. for 17 hours and comminuted.

Figure 5:
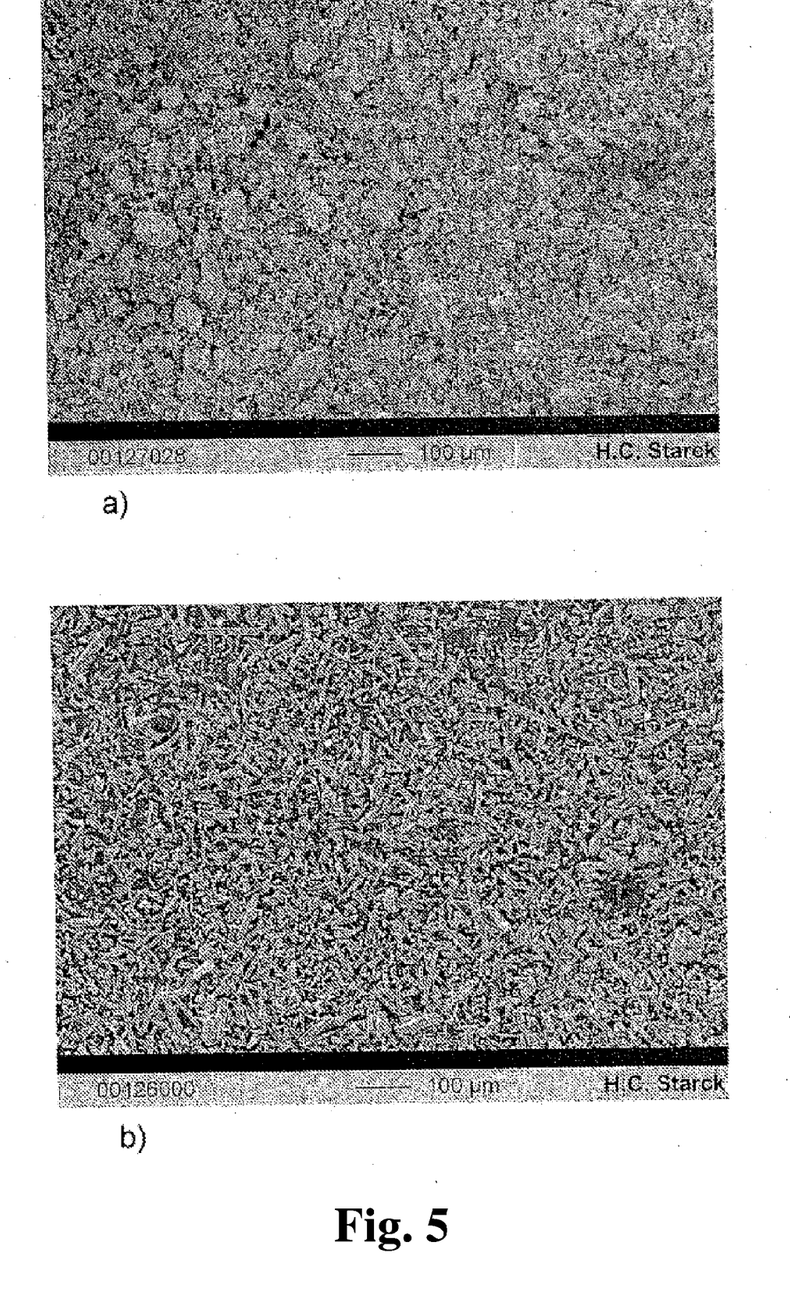
FIG. 5 shows two microscopy images, with a) depicting the material from Example 4, and b) depicting the material from Example 5.

Analysis of the resultant ceramic material corresponds to $(K_{0.46}Na_{0.42}Li_{0.05})(Nb_{0.82}Ta_{0.11}Sb_{0.04})O_3$. Under a microscope (light microscope, 10×), the compound was found to comprise a very small fraction of rod-shaped needles and a majority of very fine particles, as is shown in FIG. 5a).

Figure 9:
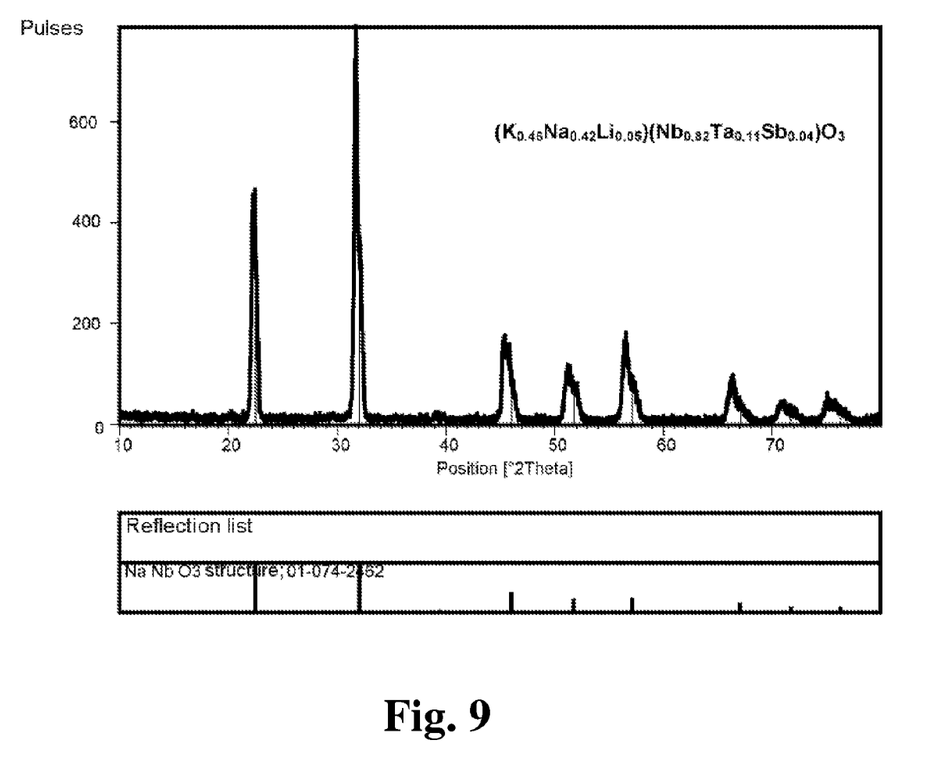
FIG. 9 shows an X-ray spectrum for the ceramic material obtained according to Example 4.

The X-ray spectrum of the ceramic material obtained according to Example 4 is shown in FIG. 9.

Example 5

In a fifth example the intention was to produce $(K_{0.16}Na_{0.80}Li_{0.04})(Nb_{0.86}Ta_{0.10}Sb_{0.04})O_3$ with rod-shaped particles. To this end, 224.4 g of KOH, 207.0 g of NaOH, 8.15 g of $LiOH*H_2O$ were cautiously dissolved in 800 ml of deionized $H_2O$ (DI). Then 147.3 ml of $H_2TaF_7$ solution in hydrofluoric acid (c=150 g/l) and 960.5 ml of $H_2NbF_7$ in hydrofluoric acid (c=116 g/l) were mixed in a Teflon beaker, and 10.51 g of $KSb(OH)_6$ was added. After the hydrofluoric solution cooled to room temperature, the alkali solution was added dropwise over the course of 105 minutes up to a pH of 12.5. The formation of a rod-shaped phase then commenced, as may be seen from the microscopy image of FIG. 5b).

The suspension was stirred for 30 minutes before the remaining alkali was added dropwise. At the end, the turbid mixture had a pH of 14, and was stirred for a further 4 hours. The suspension was filtered and the residues washed with 5 l of $NH_3$ 3% (aqueous ammonia) and with 5 l of deionized water. The suspension was subsequently dried at 60° C. for 17 hours and then comminuted. The solid was calcined at 600° C. for 2 hours, then washed with 5 liters of 3% $NH_3$ (aqueous ammonia) and with 5 liters of deionized water, and dried at 160° C. for 17 hours and comminuted.

Analysis of the resultant ceramic material corresponds to $(K_{0.16}Na_{0.79}Li_{0.01})(Nb_{0.88}Ta_{0.10}Sb_{0.03})O_3$. Under a microscope (light microscope, 10×), the compound was found to comprise rod-shaped needles, as is apparent from the SEM micrograph in FIG. 5b).

Figure 10:
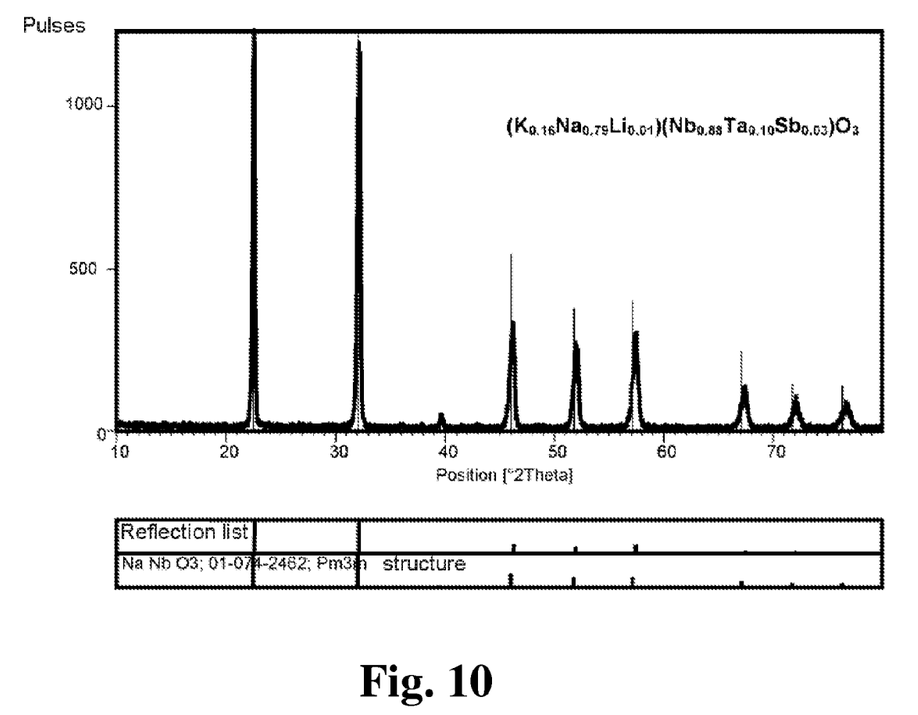
FIG. 10 shows an X-ray spectrum for the ceramic material obtained according to Example 5.

The X-ray spectrum of the ceramic material obtained according to Example 5 is shown in FIG. 10.

The ceramic materials from Examples 1 to 5 are homogeneously constructed, as is apparent from the X-ray spectra of FIGS. 6 to 10.

The present invention is not limited to embodiments described herein; reference should be had to the appended claims.

What is claimed is:

1. A process for producing a multi compound system which is homogeneous and which is at least one of hydroxide-based and oxide-based, the process comprising:
   a first alternative process which comprises:
      providing a first metal precursor in a first hydrofluoric solution,
      providing a second metal precursor in a second hydrofluoric solution, and
      mixing the first hydrofluoric solution and the second hydrofluoric solution so as to provide a mixed hydrofluoric solution comprising a dissolved first metal precursor and a dissolved second metal precursor, or a second alternative process which comprises:
   dissolving the first metal precursor and the second metal precursor in an alternative mixed hydrofluoric solution; and
   precipitating the mixed hydrofluoric solution or the alternative mixed hydrofluoric solution with a precipitation agent so as to provide a solids mixture in a suspension,
   wherein,
     the first metal precursor is from the group consisting of Mo, W, Nb, Re, Zr, Hf, V, Sb, Si, Al, and Ta,
     the second metal precursor is from the group consisting of Mo, W, Nb, Re, Zr, Hf, V, Sb, Si, Al, and Ta,
     the first metal precursor is different from the second metal precursor, and
     at least one of the first metal precursor and the second metal precursor is provided as at least one of a fluoro complex and as an oxyfluoro complex.

2. The process as recited in claim 1, further comprising, prior to the precipitating:
   admixing the mixed hydrofluoric solution or the alternative mixed hydrofluoric solution with at least one third hydrofluoric solution comprising at least one third dissolved metal from the group consisting of Mo, W, Nb, Re, Zr, Hf, V, and Ta,
   wherein, the at least one third dissolved metal is different from each of the first metal precursor and the second metal precursor.

3. The process as recited in claim 1, further comprising, prior to the precipitating:
   dissolving in the mixed hydrofluoric solution or in the alternative mixed hydrofluoric solution at least one third dissolved metal from the group consisting of Mo, W, Nb, Re, Zr, Hf, V, and Ta,
   wherein, the at least one third dissolved metal is different from each of the first metal precursor and the second metal precursor.

4. The process as recited in claim 1, further comprising:
   providing a first hydrofluoric doping element solution comprising a doping element from the group consisting of Ti, Zr, Sn, Fe, Co, Ni, Ca, Zn, Pd, Cd, Al, Si, P, Ge, As, Se, Sb, Te, Sc, Y, and Yb, or
   dissolving the doping element in at least one of the first hydrofluoric solution, the second hydrofluoric solution, the mixed hydrofluoric solution, the alternative mixed hydrofluoric solution, and the precipitating agent,
   wherein, if the doping element is present in solution in at least one of the first hydrofluoric doping element solution and in the precipitating agent, the process further comprises:
   adding at least one of the first hydrofluoric doping element solution and the precipitating agent to the first hydrofluoric solution, to the second hydrofluoric solution, to the mixed hydrofluoric solution, or to the alternative mixed hydrofluoric solution, so that the doping element is precipitated at least partly in a form of an oxide or a hydroxide.

5. The process as recited in claim 1, wherein,
the precipitating agent comprises a basic solution, a basic solid, or a basic gas, and
the precipitating is performed at a pH of the mixed hydrofluoric solution or of the alternative mixed hydrofluoric solution of between 6.5 and 14.

6. The process as recited in claim 5, wherein the basic solution comprises:
   at least one of a first alkali metal hydroxide solution and a first alkaline earth metal hydroxide solution, or
   at least one of a first mixture of two or more alkali metal hydroxide solutions and a first mixture of two or more alkaline earth metal hydroxide solutions, or
   at least one of a first mixture of one or more alkali metal hydroxide solution(s), and a first mixture of one or more alkaline earth metal hydroxide solution(s), the one or more alkali metal hydroxide solution(s) and the one or more alkaline earth metal hydroxide solutions comprising at least one dissolved amphoteric element,
   wherein,
     the first alkali metal hydroxide solution comprises a first alkali metal element, and the first alkaline earth metal hydroxide solution comprises a first alkaline earth metal element,
     the first mixture of two or more alkali metal hydroxide solutions comprises two or more alkali metal elements,
     the first mixture of two or more alkaline earth metal hydroxide solutions comprises two or more alkaline earth metal elements, and
     when precipitating the mixed hydrofluoric solution or the alternative mixed hydrofluoric solution with the basic solution as the precipitating agent so as to provide the solids mixture in the suspension, a first suspension with a first intermediate is provided which comprises, in a solids fraction, a uniform distribution of a first alkali metal element or a mixture of two or more alkali metal elements and/or a first alkaline earth metal element or a mixture of alkaline earth metal elements.

7. The process as recited in claim 6, wherein at least one of the first alkali metal hydroxide solution and the first alkaline earth metal hydroxide solution comprises at least one of an aqueous hydroxide and a hydroxide complex.

8. The process as recited in claim 5, wherein the basic solution is at least one of KOH, LiOH, NaOH, RbOH, Ca(OH)$_2$ and a hydroxide complex selected from the group consisting of zinc, aluminum, antimony, and tin.

9. The process as recited in claim 6, further comprising filtering the suspension so as to provide the solids mixture as a suspension residue.

10. The process as recited in claim 9, further comprising washing the suspension residue.

11. The process as recited in claim 9, further comprising drying the suspension residue so as to provide a dried residue, wherein the drying takes place at a temperature of $\leq 150°$ C.

12. The process as recited in claim 9, further comprising mixing the suspension residue so as to provide a mixed suspension residue.

13. The process as recited in claim 12, further comprising admixing the mixed suspension residue with a second basic solution having an aqueous basis or an organic basis so as to provide a second intermediate.

14. The process as recited in claim 13, further comprising stirring during the admixing.

15. The process as recited in 14, wherein the second basic solution comprises at least one of,
   an alkali metal hydroxide solution,
   an alkaline earth metal hydroxide solution,
   a mixture of two or more alkali metal hydroxide solutions, and
   a mixture of two or more alkaline earth metal hydroxide solutions,
   wherein,
     the alkali metal hydroxide solution comprises an alkali metal element,
     the alkaline earth metal hydroxide solution comprises an alkaline earth metal element, the mixture of two or more alkali metal hydroxide solutions comprises two or more alkali metal elements, and the mixture of two or more alkaline earth metal hydroxide solutions comprises two or more alkaline earth metal elements, wherein, the second intermediate comprises a uniform distribution of an alkali metal element or a mixture of two or more alkali metal elements and/or an alkaline earth metal element or a mixture of alkaline earth metal elements.

16. The process as recited in claim 15, wherein the second basic solution is added at a temperature of between 0° C. and 40° C. and under a pressure of between 800 mbar and 1200 mbar.

17. The process as recited in claim 15, further comprising heat treating the second intermediate at a temperature of between 100° C. and 1000° C. so as to provide a ceramic material and a byproduct.

18. The process as recited in claim 17, further comprising washing out the byproduct with water.

19. The process as recited in claim 18, further comprising at least one of drying and grinding the ceramic material so as to provide a homogeneous ceramic powder for a shaping.

20. The process as recited in claim 19, further comprising adding an additive to the homogenous ceramic powder so as to control a particle agglomeration during at least one of the grinding and drying.

21. The process as recited in claim 20, further comprising at least one of drying, slurrying, isolating, filtering and comminutating the homogeneous ceramic powder.

22. The process as recited in claim 1, further comprising drying the suspension so as to provide a dried residue, wherein the drying takes place at a temperature of ≤150° C.

23. The process as recited in claim 1, further comprising mixing the suspension so as to provide a mixed suspension.

24. The process as recited in claim 22 or 23, further comprising admixing the suspension, the dried residue, or the mixed suspension with a second basic solution having an aqueous basis or an organic basis so as to provide a second intermediate.

25. The process as recited in claim 24, further comprising stirring during the admixing.

26. The process as recited in claim 25, wherein the second basic solution comprises at least one of, an alkali metal hydroxide solution, an alkaline earth metal hydroxide solution, a mixture of two or more alkali metal hydroxide solutions, and a mixture of two or more alkaline earth metal hydroxide solutions, wherein, the alkali metal hydroxide solution comprises an alkali metal element, the alkaline earth metal hydroxide solution comprises an alkaline earth metal element, the mixture of two or more alkali metal hydroxide solutions comprises two or more alkali metal elements, and the mixture of two or more alkaline earth metal hydroxide solutions comprises two or more alkaline earth metal elements, wherein, the second intermediate comprises a uniform distribution of an alkali metal element or a mixture of two or more alkali metal elements and/or an alkaline earth metal element or a mixture of alkaline earth metal elements.

27. The process as recited in claim 26, wherein the second basic solution is added at a temperature of between 0° C. and 40° C. and under a pressure of between 800 mbar and 1200 mbar.

28. The process as recited in claim 27, further comprising heat treating the second intermediate at a temperature of between 100° C. and 1000° C. so as to provide a ceramic material and a byproduct.

29. The process as recited in claim 28, further comprising washing out the byproduct with water.

30. The process as recited in claim 29, further comprising at least one of drying and grinding the ceramic material so as to provide a homogeneous ceramic powder for a shaping.

31. The process as recited in claim 30, further comprising adding an additive to the homogenous ceramic powder so as to control a particle agglomeration during at least one of the grinding and drying.

32. The process as recited in claim 31, further comprising at least one of drying, slurrying, isolating, filtering and comminutating the homogeneous ceramic powder.

* * * * *